United States Patent
Campbell et al.

(10) Patent No.: US 11,112,351 B2
(45) Date of Patent: Sep. 7, 2021

(54) PARTIAL SUBMERSION TESTING FOR PLATING DEFECTS

(71) Applicant: International Business Machines Corporation, Armonk, NY (US)

(72) Inventors: Eric J Campbell, Rochester, MN (US); James Anderl, Rochester, MN (US); Sarah K. Czaplewski-Campbell, Rochester, MN (US); Jason T. Wertz, Pleasant Valley, NY (US); Brandon M. Kobilka, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 16/571,311

(22) Filed: Sep. 16, 2019

(65) Prior Publication Data

US 2021/0080379 A1     Mar. 18, 2021

(51) Int. Cl.
*G01N 19/08*     (2006.01)
*H05K 1/11*       (2006.01)

(52) U.S. Cl.
CPC ........... *G01N 19/08* (2013.01); *H05K 1/115* (2013.01); *H05K 2201/09545* (2013.01)

(58) Field of Classification Search
CPC .............. G01N 19/08; H01K 1/115; H01K 2201/09545
USPC ........................................................ 73/37
See application file for complete search history.

(56) References Cited

U.S. PATENT DOCUMENTS

| | | | |
|---|---|---|---|
| 3,744,557 | A | 7/1973 | Costello |
| 4,277,175 | A | 7/1981 | Karasaki et al. |
| 4,560,273 | A | 12/1985 | Ando et al. |
| 4,964,948 | A | 10/1990 | Reed |
| 7,607,824 | B2 | 10/2009 | Chandler et al. |
| 2002/0031250 | A1 | 3/2002 | Saito et al. |
| 2013/0016465 | A1* | 1/2013 | Chamberlin ............. H05K 3/22 361/679.02 |
| 2018/0272573 | A1 | 9/2018 | Czaplewski et al. |

OTHER PUBLICATIONS

"Air Flow Measurement in Electronic Systems," Thermal Analysis, Aug. 7, pp. 8-11. www.qats.com/Download/Qpedia_Aug07_Air%20Flow%20Measurement6.ashx.
"Surface-tension values," Wikipedia, printed: Mar. 18, 2019, 2 pages. https://en.wikipedia.org/wiki/Surface-tension_values.
(Continued)

*Primary Examiner* — Nimeshkumar D Patel
*Assistant Examiner* — Jean F Morello
(74) *Attorney, Agent, or Firm* — Jorge R. Maranto

(57) ABSTRACT

A method and a system for detecting defects in plated-through hole by partially submerging a printed circuit board in a fluid bath. The method includes partially submerging a printed circuit board on a first side and measuring a capillary height difference within a plated-through hole and the surrounding fluid bath. The method further includes partially submerging the printed circuit board on a second side and measuring a second capillary height difference within the plated-through hole and the surrounding fluid bath. The method also includes comparing the measured values with predetermined values to determine the quality of the plated-through hole.

20 Claims, 6 Drawing Sheets

(56) References Cited

OTHER PUBLICATIONS

"Capillary action," Wikipedia, printed: Mar. 18, 2019, 11 pages. https://en.wikipedia.org/wiki/Capillary_action#Height_of_a_meniscus.
Brennen, C., "Contact Angle," an Internet Book on Fluid Dynamics, Apr. 9, 2004, 2 pages. brennen.caltech.edu/fluidbook/fluidstatics/contactangle.pdf.
Campbell et al., "Non-Destructive Testing for Plating Defects," U.S. Appl. No. 16/571,297, filed Sep. 16, 2019.
List of IBM Patents or Patent Applications Treated as Related, Signed Sep. 16, 2019, 2 pages.

* cited by examiner

PARTIAL SUBMERSION TESTING FOR PLATING DEFECTS

BACKGROUND

The present disclosure relates to plated-through holes, and more specifically, to a method and a system for detecting defects within and/or on plated-through holes in a non-destructive manner.

Plated-through holes are used in the design and production of printed circuit boards to electrically interconnect traces on different layers. Electronic components can then be inserted into the plated-through holes and soldered into place. During the fabrication process, plated-through holes are formed by drilling or selectively etching holes in the board which are then coated or plated with one or more metals (e.g., copper). However, the plated-through holes may contain defects along the sidewalls of the plating. If a plated-through hole has a sufficiently large enough defect, a crack in the metal may result. As a result of a crack in the plating, failures in the printed circuit board, such as open circuitry and electrical failure, may occur. Plated-through hole cracking can also be accelerated by anomalies and non-uniformity in the plating (e.g., nodules, ridges, etc.) creating localized stress concentrations.

SUMMARY

Various embodiments are directed to methods of non-destructively detecting defects in plated-through holes. The method includes sealing a plated-through hole on a printed circuit board to detect for possible defects along the sidewall of the plated-through hole. The method further includes applying an airflow through the plated-through hole and measuring the airflow entering the plated-through hole at the gasket to determine the initial airflow measurement. The method also includes measuring the airflow again as it exits the plated-through hole to determine an exit airflow measurement. A determination of the quality of the plated-through hole is made by a method of analyzing the initial airflow measurement and the exit airflow measurement with a predetermined measurement.

Further embodiments are directed to a method of non-destructively detecting defects in plated-through holes by probing the through-holes. The method includes inserting a tip of a probe into the plated-through hole. The tip and probe of a predetermined size such that the tip and probe do not make contact with the sidewall of the plated-through hole. The method further includes forcing air through opposing nozzles at the tip of the probe which forces air to blow against the sidewall. The resulting back pressure is then measured. The method also includes calculating the diameter of the hole. The calculated diameter is compared to a reference hole to determine the quality of the plated-through hole being tested.

Additional embodiments are directed to a method of detecting defects in plated-through hole by partially submerging a printed circuit board in a fluid bath. The method includes partially submerging a printed circuit board on a first side and measuring a capillary height difference within a plated-through hole and the surrounding fluid bath. The method further includes partially submerging the printed circuit board on a second side and measuring a second capillary height difference within the plated-through hole and the surrounding fluid bath. The method also includes comparing the measured values with predetermined values to determine the quality of the plated-through hole.

Embodiments are further directed to a system to detect defects in plated-through holes, including at least one processing component and at least one memory component. The system includes an orifice plate for sealing a plated-through hole on a printed circuit board which collects initial airflow measurements and an airflow generator for passing air through the orifice plate and the plated-through hole. The system also includes an anemometer for taking measurements of airflow exiting the plated-through hole. The system further includes a processing device for analyzing the initial airflow measurements and the exit airflow measurements to determine the quality of the plated-through hole.

BRIEF DESCRIPTION OF THE DRAWINGS

These and other features, aspects, and advantages of the embodiments of the disclosure will become better understood with regard to the following description, appended claims, and accompanying drawings where:

Figure 1:
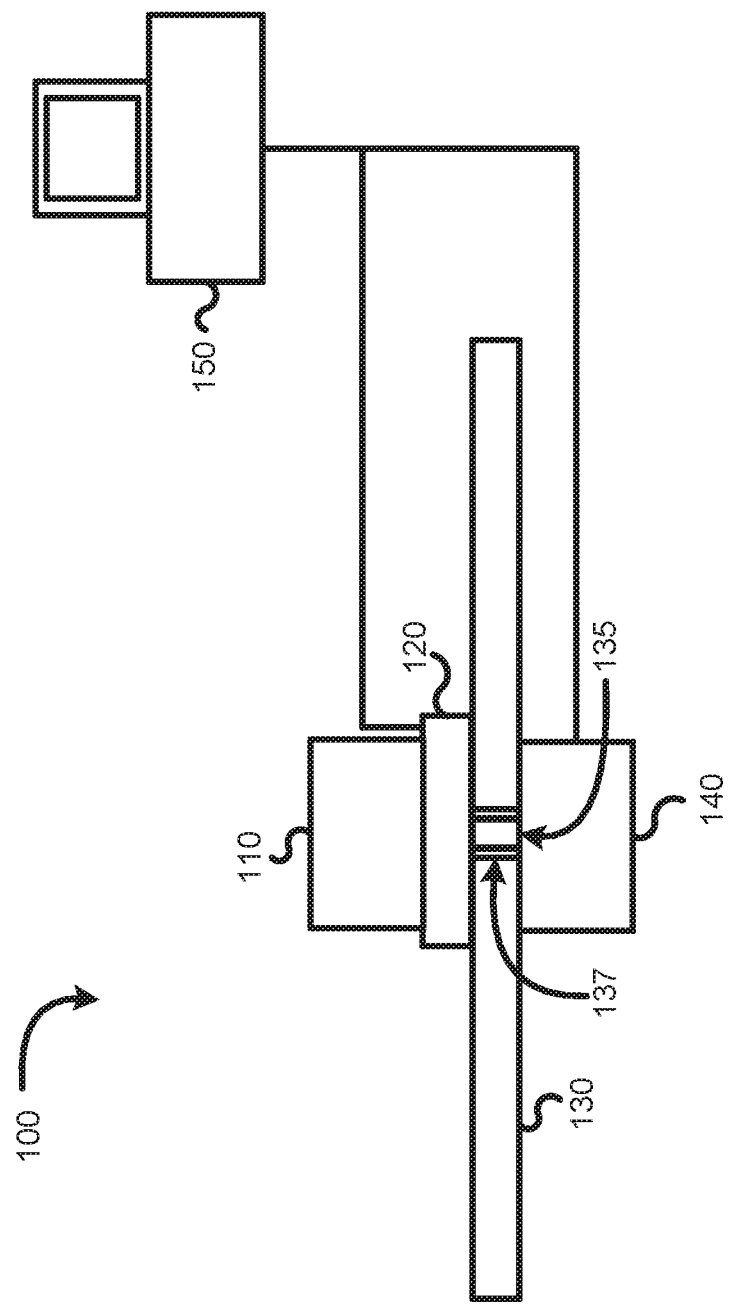
FIG. 1 is a block diagram illustrating a plated-through hole defect detection system testing a plated-through hole on a printed circuit board, according to embodiments of the present disclosure.

While the present disclosure is amenable to various modifications and alternative forms, specifics thereof have been shown by way of example in the drawings and will be described in detail. It should be understood, however, that the intention is not to limit the particular embodiments described. On the contrary, the intention is to cover all modifications, equivalents, and alternatives falling within the scope of the present disclosure. Like reference numeral are used to designate like parts in the accompanying drawings

DETAILED DESCRIPTION

Defects along sidewalls of plated-through holes may potentially cause failure during assembly and can be considered as a long term reliability issue for printed circuit boards. This is due to, at least in part, the laminate material used in printed circuit boards having a thermal expansion coefficient greater than that of the plating material used on through holes (e.g., copper). As a result, significant stress is placed on the plated-through holes during thermal cycling. Excessive stress can cause circumferential barrel cracks in the plated-through holes, resulting in electrical failure. Furthermore, plated-through hole cracking can be accelerated by other types of defects such as non-uniformity in the plating that create localized stress concentrations. These defects may result in an intermittent open, or even a dead open of the associated circuit, due to the high thermal stress of an assembly process or due to repeated thermal cycling during the application stage.

Typically, electronic manufacturers and assemblers employ destructive sampling techniques which involve cutting a sample printed circuit board to examine the plated-through holes for any possible defects. Other types of testing include measuring electrical resistance or conductivity. These types of processes can become time consuming and wasteful. Also, measuring resistance and conductivity may not necessarily detect defects with a weak connectivity. For example, a plated-through hole may function as expected, but will ultimately fail prematurely due to repeated thermal cycling. Also, a defect may not entirely encircle the sidewall of a through-hole and thus may not be detected during testing. As such, a test of conductivity is insufficient in detecting an array of possible defects along the sidewalls of the plated-through holes.

Various embodiments are directed to a system and method for non-destructively detecting defects in plated-through holes. The method includes sealing a plated-through hole on a printed circuit board to detect for possible defects along the sidewall of the plated-through hole. The method further includes applying an airflow through the plated-through hole and measuring the airflow entering the plated-through hole at the gasket to determine an initial airflow measurement. The method also includes measuring the airflow again as it exits the plated-through hole to determine an exit airflow measurement. A determination of the quality of the plated-through hole is made by analyzing the initial airflow measurement and the exit airflow measurement with a predetermined measurement.

FIG. 1 is a block diagram illustrating a plated-through hole defect detection system 100 for non-destructively detecting defects in plated-through holes, according to embodiments of the present disclosure. The plated-through hole defect detection system 100 includes an air generator 110, an orifice plate 120, an anemometer 140, and a processing device 150. The plated-through hole defect detection system 100 works on a printed circuit board 130 that includes a plated-through hole 135 having a sidewall 137. In some embodiments, the processing device 150 is included within or embodied by a computer system 600, described below.

The air generator 110 is a component of the plated-through hole defect detection system 100 configured to generate an airflow that passes through the orifice plate 120 and the plated-through hole 135. The air generator 110 can provide compressed air for the operation of processes and systems. In some embodiments, the air generator 110 includes an airflow controller configured to control the output of the air generator 110. For example, the airflow controller can control the load, the speed, the pressure, and the like. Depending on the aspect ratio of the plated-through hole 135, the air generator 110 can be adjusted to accurately deliver airflow through the plated-through hole 135 to determine the quality of the plated-through hole.

The orifice plate 120 is a component of the plated-through hole defect detection system 100 configured to seal the plated-through hole 135, or of a grouping of plated-through holes, on the printed circuit board 130. The orifice plate 120 is further configured to measure flow rate of air entering the plated-through hole 135. The flow rate can include volumetric or mass flow rate and can be adjusted based on a predetermined calculation. The orifice plate 120 can be comprised of a thin plate with a predetermined opening sized to allow for accurate measurements of airflow entering into the plated-through hole 135. The orifice plate 120 is also configured to measure the velocity of the airflow entering into the plated-through hole 135 while maintaining a constant air pressure.

The printed circuit board 130 is formed with one or more layers of dielectric and conductive material to form a substrate carrier. In some embodiments, the printed circuit board 130 is a multilayer circuited substrate where various layers of circuitry formed with circuit elements and other conductive traces. In the printed circuit board 130, one or more plated-through holes 135 are formed. The plated-through hole 135 can be formed by laser or mechanically drilling a hole or via and then plating the sidewall 137 of the hole or via with conductive plating layers to form electrical connections on the top and bottom surfaces of the printed circuit board 130.

The anemometer 140 is a component of the plated-through hole defect detection system 100 configured to measure airflow exiting the plated-through hole 135. Depending on the predetermined measurement requested, the anemometer 140 can be a velocity anemometer or a pressure anemometer. For example, the anemometer 140 can be a cup anemometer, a vane anemometer, a hot wire anemometer, a laser doppler anemometer, and the like, for measuring velocity and mass flow rate. The anemometer 140 can also be a plate anemometer, a tube anemometer, and the like, for measuring pressure.

The processing device 150 is a component of the plated-through hole defect detection system 100 configured to analyze the airflow measurements collected from the orifice plate 120 and the anemometer 140 to determine the quality of the sidewall 137 of the plated-through hole 135. Based on the analyzation of the airflow measurements, the processing device 150 can determine the presence or the absence of defects on the sidewall 137 of the plated-through hole 135.

Figure 2:
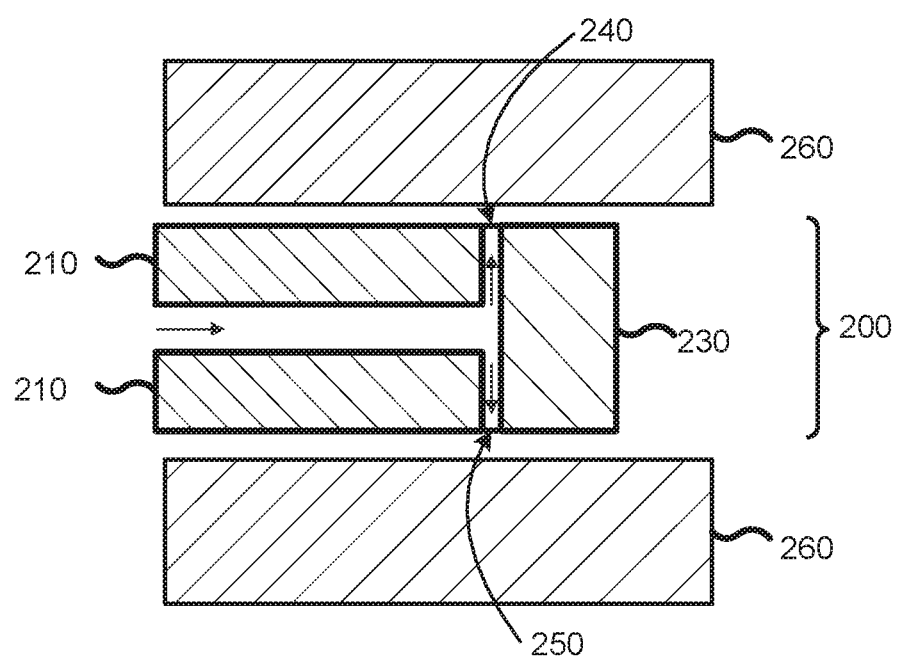
FIG. 2 is a partial cross-sectional view illustrating a test probe device having an airflow tip inserted into a plated-through hole of a printed circuit board, according to embodiments of the present disclosure.

FIG. 2 is a cross-sectional view of a test probe device 200 partially inserted into a plate-through hole 260, according to embodiments of the present disclosure. The test probe device 200 having a body 210 with a tip 230 encasing two opposing air gauge nozzles 240 and 250. The test probe device 200 having a predetermined geometric dimension to fit within the width of the plated-through hole 260 such that the test probe device 200 avoids contact with the sidewall of the plated-through hole 260. In some embodiments, the body 210 and tip 230 comprise of hardened steel incorporating the air gauge nozzles 240 and 250.

The test probe device 200 allows for air to pass through the body 210 and exit through the opposing air gauge nozzles 240 and 250. As air is forced through the probe, debris can be removed from the plated-through hole 260 which can allow for an accurate assessment of the quality of the plating. Further, as air exits the plated-through hole, measurements can be collected to determine if defects are present along the sidewalls of the plated-through hole 260.

As air is passed through the body 210 and through the nozzles 240, 260, back pressure is produced by the sidewalls of the plated-through hole 260. An air gauge readout (e.g., an air comparator, etc.) can measure the resulting back pressure and display the size of the sidewall. The back pressure produced by the test probe device 200 can vary depending on the distance from the nozzles 240, 250 are from the plated-through hole 260. As such, knowing the diameter of the test probe device 200 and the resulting back pressure on the plated-through hole 260, the diameter of the plated-through hole 260 can be determined. Once the diameter of the plated-through hole is calculated, that diameter can be compared with a desired diameter to determine whether or not the plated-through hole 260 contains defects.

Figure 3:
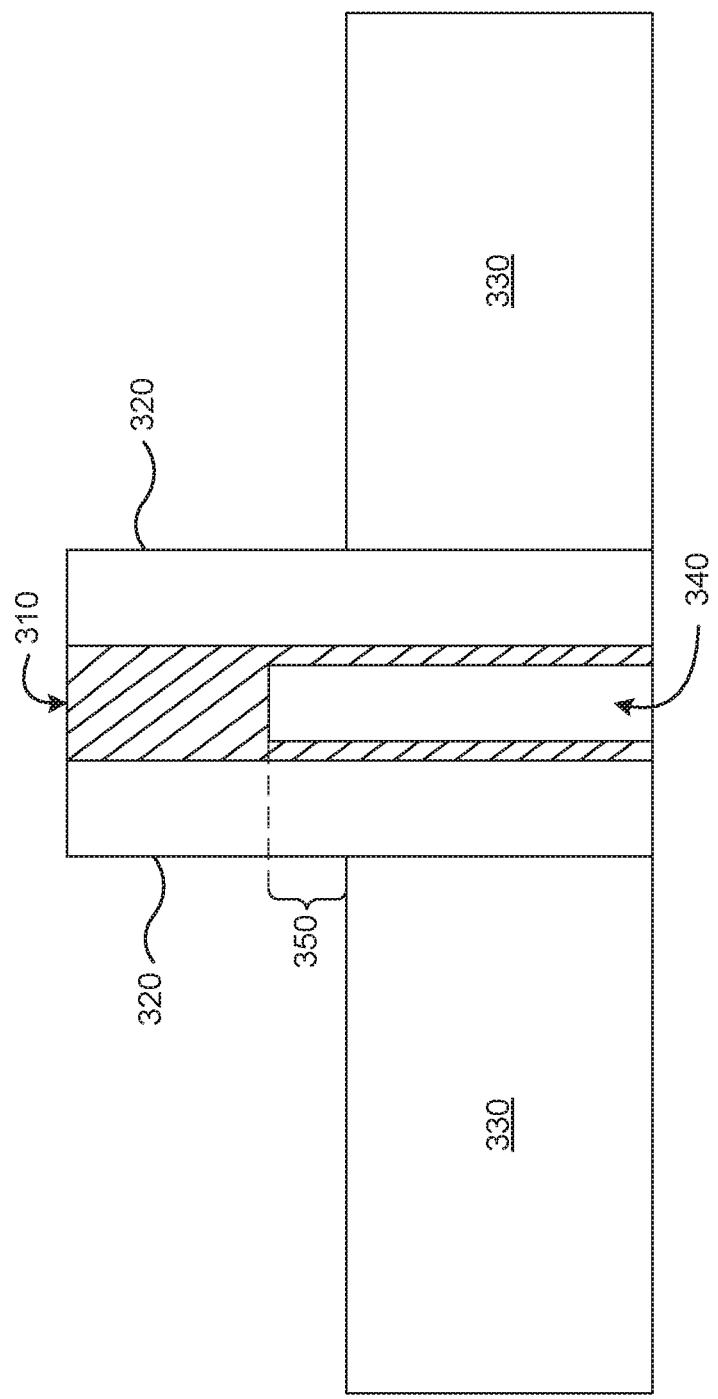
FIG. 3 is a partial cross-sectional view illustrating a partially submerged printed circuit board having fluid filled into a plated-through hole by capillary action, according to embodiments of the present disclosure.

FIG. 3 is a cross-sectional view of a printed circuit board 320 (e.g., which may be the same as, or substantially similar to, the printed circuit board 130 of FIG. 1) partially submerged in a fluid bath 330 having capillary fluid 340 filled into a plated-through hole 310 by capillary action, according to embodiments of the present disclosure. "Capillary action", "capillarity", "capillary motion", or "capillary effect", is the ability of a liquid to flow in narrow spaces as a result of surface tension.

By partially submerging a printed circuit board 320 in a fluid bath 330, capillary fluid 340 can fill the plated-through hole 310 by capillary action, and a meniscus height 350 of the capillary fluid 340 can be measured. The meniscus height 350 can be measured using laser as well as other optical methods capable of determining the meniscus height 350. Typically, the meniscus height 350 is dependent on the diameter of the plated-through hole 310. Changes in the diameter resulting from surface roughness, nodules, and/or changes in plating thickness creates a measurable change in meniscus height. Therefore, the meniscus height 350 can be used as an indicator of plating quality of the plated-through hole 310.

In some embodiments, the printed circuit board 320 can be flipped to allow for both halves of the plated-through hole 310 to be analyzed. The meniscus height 350 may not reach the entire height of the plated-through hole 310, so to allow for a complete analysis of the plated-through hole in its entirety, the printed circuit board 320 can be flipped so both sides can be measured for a meniscus height 350.

Figure 4:
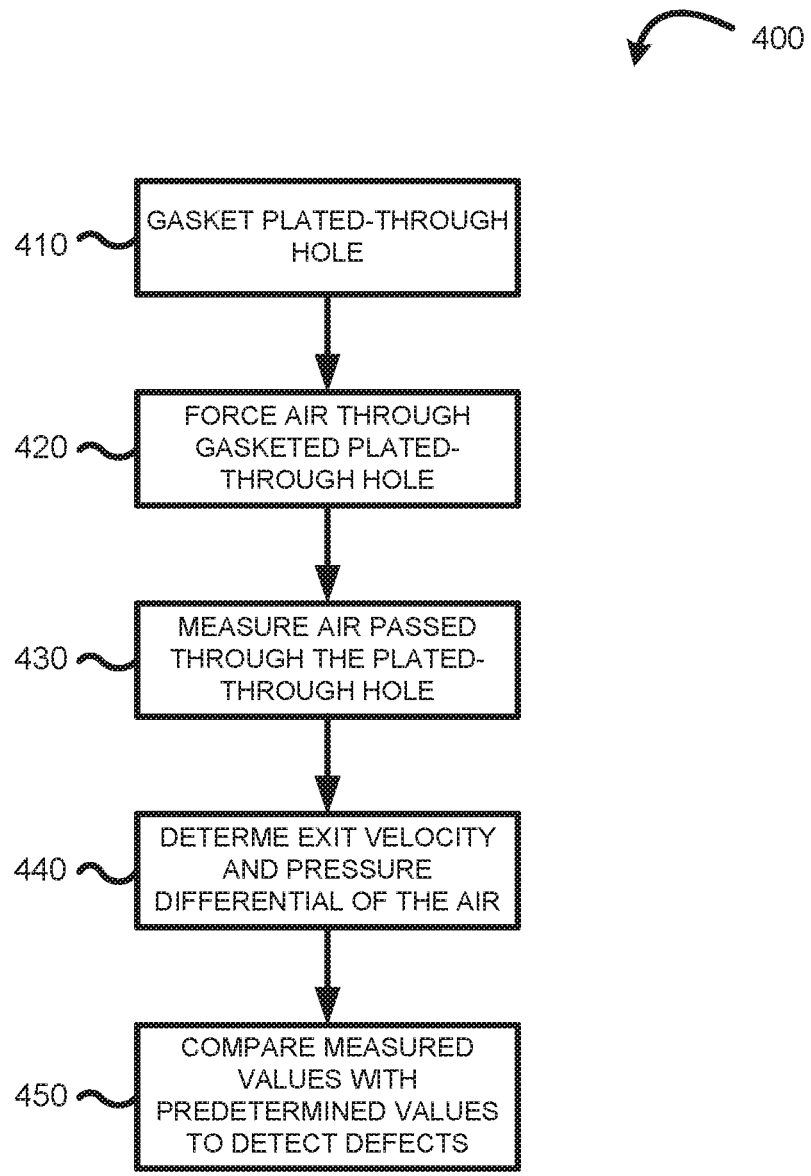
FIG. 4 is a flow diagram illustrating a process of detecting defects on a plated-through hole by passing air through the plated-through hole, according to embodiments of the present disclosure.

FIG. 4 is a flow diagram illustrating a process 400 of detecting defects on a plated-through hole by passing air through the plated-through hole, according to embodiments of the present disclosure. There is a relationship between the pressure of a fluid and the velocity of a fluid. When the velocity of a fluid increase, the pressure of the fluid decreases, and vice versa. By applying a fixed pressure and containment volume on one side of a plated-through hole, the mass flow rate and velocity can be calculated for a known aperture size of the plated-through hole. In some embodiments, when exit velocity and pressure differential are detected, the effective aperture size of the plate-through hole can be calculated. Using the effective aperture size, a determination can be made on the quality of the plated-through hole.

A printed circuit board with non-defective plated-through holes can be used to calibrate the system 100. Once the calibration is conducted, the system 100 can be used on printed circuit boards of unknown quality. Plated-through hole defects can alter how the air flows through the plated-through hole and therefore can be used as an indicator of quality.

The orifice plate 120 seals around the plated-through hole 135. This is illustrated at step 410. The orifice plate 120 can be positioned in such a way as to allow for an accurate measurement reading of airflow rate, pressure, or for restricting airflow into the plated-through hole. By sealing around the plated-through hole, the orifice plate can be used to determine either a volumetric or mass airflow rate, depending on the calculation requested by an operator.

Once the orifice plate 120 is sealed around the plated-through hole 135, the airflow generator 110 can begin to force air through the orifice plate and the plated-through hole. This is illustrated at step 420. As air is passed through the orifice plate airflow measurements can be collected at the orifice plate 120 as it air enters into the plated-through hole 135. This is illustrated at step 430. The measurements collected by the orifice plate 120 can be transmitted to the processing device 150 for further evaluation.

In one embodiment, the mass flow rate is determined according to equation 1 as shown:

$$q_m = \frac{C_d}{\sqrt{1-\beta^4}} \epsilon \frac{\pi}{4} d^2 \sqrt{2 \rho_1 \Delta p} \qquad \text{Equation 1}$$

Where $q_m$ represents the mass flow rate. $C_d$ represents the coefficient of discharge. This can be typically represented between 0.6 and 0.85 depending on the orifice geometry and tapping. $\beta$ represents the diameter ratio of the orifice plate 120 diameter d to the plated-through hole 135 diameter D. Where E represents an expansibility factor. Typically, 1 is used for incompressible gases and most liquids, and decreasing with pressure ratio across the orifice plate 120. Where $p_1$ represents the fluid density in plane of upstream tapping, and $\Delta p$ represents the differential pressure measured across the orifice plate 120.

Additional airflow measurements can also be collected at the orifice plate 120. For example, the velocity of the airflow can be calculated at the orifice plate 120. In one embodiment, the velocity is determined according to equation 2 as shown:

$$V = C_d \frac{\sqrt{2\rho_1 \Delta \rho}}{\rho_1} \qquad \text{Equation 2}$$

Airflow measurements are collected of the airflow exiting the plated-through hole 135. This is illustrated at step 440. In some embodiments, the exit velocity of the airflow and the pressure differential are measured. The measurements can be collected by the anemometer placed on the opposed end of the plated-through hole 135 to the orifice plate 120. The anemometer can also transmit those measurements to the processing device 150 for evaluation.

The processing device 150 can compare the measured values collected of the airflow entering the plated-through hole 135 with measured values collected of the airflow exiting the plated-through hole 135. This is illustrated at step 450. In some embodiments, by comparing velocities and the pressure differential, the processing device 150 can determine the effective aperture size of the plated-through hole. If the variance between the effective aperture size and the expected aperture size is within a certain threshold, the plated-through hole 135 can be determined to have minimal defects. However, if the effective aperture size exceeds an allowable threshold over the expected aperture size, then the plated-through hole 135 is defective.

Figure 5:
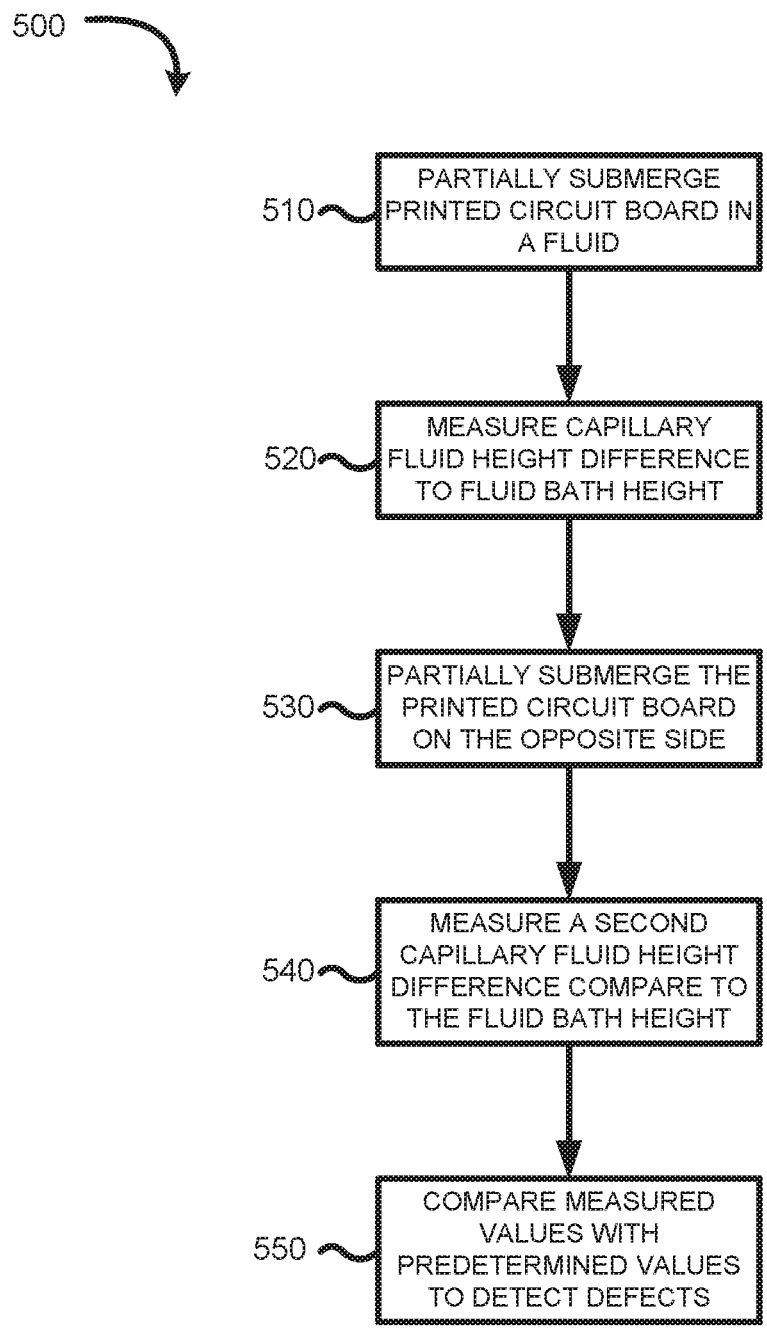
FIG. 5 is a flow diagram illustrating a process of detecting defects on a plated-through hole by partially submerging a printed circuit board in a fluid bath, according to embodiments of the present disclosure.

FIG. 5 is a flow diagram illustrating a process 500 of detecting defects on a plated-through hole by partially submerging a printed circuit board in a fluid bath, according to embodiments of the present disclosure. A change in meniscus height during the process 500 can be used as an indicator that there is a defect in the plated-through hole 310. For example, a 28 micron reduction in cylinder radius would cause a height change of the meniscus of approximately 507 microns. This change in height can be detected using known methods of measurements. This illustrates that even minor defects along plated-through holes can be detected using process 500.

A printed circuit board 320 is partially submerged into a fluid bath 330. This is illustrated at step 510. As the printed circuit board 320 is submerged into the fluid bath, capillary fluid can begin to fill the plated-through hole 310. In some embodiments, the fluid bath 330 is initially empty and is gradually filled with fluid. This allows for continuous measurements of the meniscus height of the capillary fluid in the plated-through hole. It should be noted, that the printed circuit board 320 may contain one or more plated-through hole 310 which can all be measured during this process 500.

The fluid bath 330 can comprise of varying liquid solutions to maintain the operability of the printed circuit board so as to allow this process 500 to be non-destructive. Also, the fluid bath 330 can incorporate different conditions to allow for optimal measurements. For example, the fluid bath could be used in combination with, and subjected to, different atmospheric temperatures, pressures, and the like. Additionally, dyes or particles could be added into the fluid bath to assist in the detection of the meniscus height by the measuring tool.

A measurement of capillary meniscus height 350 that is the measurement between the capillary fluid 340 and the fluid bath 330 is measured. This is illustrated at step 520. The capillary meniscus height 350 can be measured in various ways, such as by taking laser measurements of the fluid bath and of the capillary fluid. Other optical methods can also be employed to determine the meniscus height 350. In some embodiments, measurements are collected repeatedly as fluid fills the fluid bath. The change in height of the meniscus height to the fluid bath height can be monitored in this way. Deviations in the change in height may indicate a change in the plated-through hole diameter, which can indicate possible defects along the plated-through hole. In some embodiments, when a deviation occurs as the fluid fills the bath, the fluid bath height and the meniscus height are recorded as deviations occur. This data can then be used to locate which layer in the printed circuit board 320 the defect is located.

The printed circuit board is flipped, and the opposing side is partially submerged into the fluid bath. This is illustrated at step 530. This step can be accomplished in a substantially similar manner as step 510. In some embodiments, the fluid bath 330 is emptied and is gradually refilled with fluid. This allows for continuous measurements of the meniscus height 350 of the capillary fluid in the plated-through hole 310. It should be noted, that the printed circuit board 320 may contain one or more plated-through holes which can all be measured during this process 500.

A second measurement of capillary meniscus height 350 which indicates the difference between the capillary fluid 340 and the fluid bath 330 is collected. This is illustrated at step 540. The measurement techniques used in step 520 can be employed at this step. By taking a second measurement, the entirety of the plated-through hole is inspected for defects along its sidewall. Once both measurements are collected, a comparison can be made using measurements collected from a plate-through hole with no defects with the measurements collected during the process 500. If the meniscus height deviation is beyond a threshold of allowability, it can be determined that a defect is present along the sidewall of the plated-through hole.

In some embodiments, plating thickness at the center of the plated-through hole can also be determined to ensure plating thickness consistency throughout the sidewall of the plated-through hole 310. Printed circuit boards with a high aspect ratio commonly suffer from varying plating thickness between the ends of the board compared with the center of the board. For example, the middle layers of a printed circuit board may have thinner plating along sidewalls of plated-through holes compared to their ends. The "aspect ratio" of a printed circuit board can be defined as the ratio between the thickness of a printed circuit board to the diameter of the drilled via or plated-through hole.

To measure the plating uniformity, the printed circuit board 320 can be partially submerged into the fluid bath 330 as indicated in step 510. The meniscus height can then be measured similar to step 520. Using Jain's law, the radius of the cylinder can then be calculated based on the meniscus height measured. If the radius is larger than the expected radius, the plating thickness can be determined to be thinner in the middle layers of the printed circuit board. This type of anomaly can be considered as a defect and would be detrimental to the viability of the printed circuit board.

Figure 6:
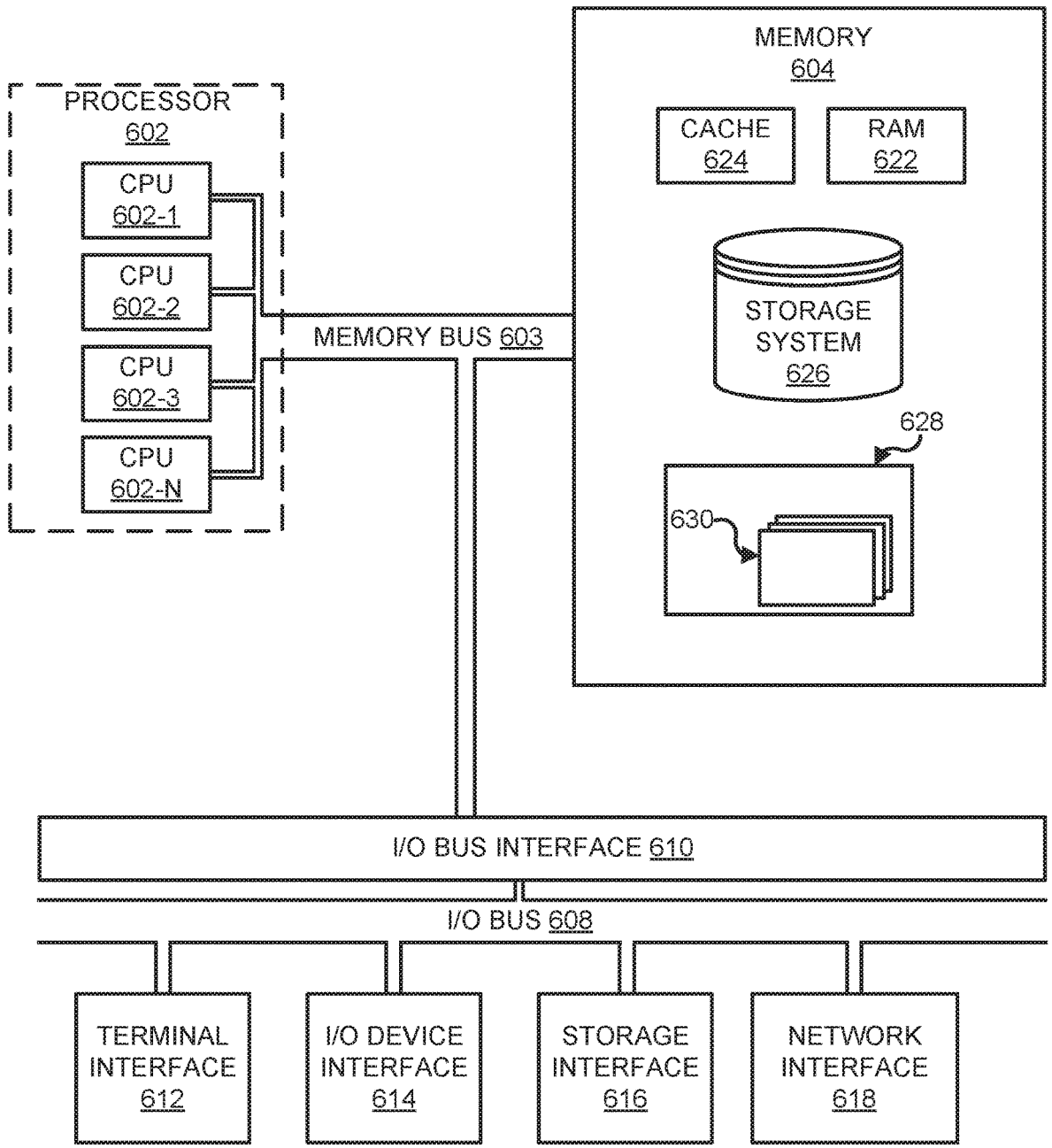
FIG. 6 is a high-level block diagram illustrating an example computer system that may be used in implementing one or more of the methods, tools, and modules, and any related functions, described herein, according to embodiments of the present disclosure.

Referring now to FIG. 6, shown is a high-level block diagram of an example computer system 600 (e.g., computing device 150) that may be used in implementing one or more of the methods, tools, and modules, and any related functions, described herein (e.g., using one or more processor circuits or computer processors of the computer), in accordance with embodiments of the present disclosure. In some embodiments, the major components of the computer system 600 may comprise one or more processors 602, a memory 604, a terminal interface 612, a I/O (Input/Output) device interface 614, a storage interface 616, and a network interface 618, all of which may be communicatively coupled, directly or indirectly, for inter-component communication via a memory bus 603, a I/O bus 608, and an I/O bus interface 610.

The computer system 600 may contain one or more general-purpose programmable central processing units (CPUs) 602-1, 602-2, 602-3, and 602-N, herein generically referred to as the processor 602. In some embodiments, the computer system 600. may contain multiple processors typical of a relatively large system; however, in other embodiments the computer system 600 may alternatively be a single CPU system. Each processor 602 may execute instructions stored in the memory 604 and may include one or more levels of on-board cache.

The memory 604 may include computer system readable media in the form of volatile memory, such as random-access memory (RAM) 622 or cache memory 624. Computer system 600 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, the memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

Although the memory bus 603 is shown in FIG. 6 as a single bus structure providing a direct communication path among the processors 602, the memory 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 600 may, in some embodiments, contain multiple I/O bus interface units, multiple I/O buses, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 600 may be a multi-user mainframe computer system, a single-user system, or a server computer or similar device that has little or no direct user interface but receives requests from other computer systems (clients). Further, in some embodiments, the computer system 600 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 600. In some embodiments, however, individual components may have greater or lesser complexity than as represented in FIG. 6, components other than or in addition to those shown in FIG. 6 may be present, and the number, type, and configuration of such components may vary.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 628 and/or program modules 630 generally perform the functions or methodologies of various embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of detecting defects on a plated-through hole using a fluid bath, the method comprising:
   submerging, partially, a first side of a printed circuit board into a fluid bath to allow for capillary fluid to partially fill a plated-through hole on the printed circuit board;
   measuring a first meniscus height of the capillary fluid in the plated-through hole; and
   comparing the first meniscus height with a calibrated height to determine a quality of the plated-through hole.

2. The method of claim 1, further comprising:
   submerging, partially, a second side of the printed circuit board into the fluid bath to allow for the capillary fluid to partially fill the plated-through hole;
   measuring a second meniscus height of the capillary fluid in the plated-through hole; and
   comparing the second meniscus height with the calibrated height to determine the quality of the plated-through hole.

3. The method of claim 1, wherein the fluid bath is gradually filled to partially submerge the first side of the printed circuit board.

4. The method of claim 3, wherein measuring the first meniscus height is continuously measured as the fluid bath is gradually filled.

5. The method of claim 2, wherein the fluid bath is gradually filled to partially submerge the second side of the printed circuit board.

6. The method of claim 5, wherein measuring the second meniscus height is continuously measured as the fluid bath is gradually filled.

7. The method of claim 1, wherein the fluid bath contains dyes to improve measuring the first meniscus height.

8. The method of claim 1, further comprising:
   calculating a radius of the plated-through hole based on the first meniscus height; and
   determining whether the radius deviates from an expected radius for the plated-through hole.

9. The method of claim 2, further comprising:
   calculating a radius of the plated-through hole based on the second meniscus height; and
   determining whether the radius deviates from an expected radius for the plated-through hole.

10. A computer program product for detecting defects on a plated-through hole using a fluid bath, the computer program product comprising a computer readable storage medium having program instruction embodied therewith, wherein the program instructions:
    submerge, partially, a first side of a printed circuit board into a fluid bath to allow for capillary fluid to partially fill a plated-through hole on the printed circuit board;
    measure a first meniscus height of the capillary fluid in the plated-through hole; and
    compare the first meniscus height with a calibrated height to determine a quality of the plated-through hole.

11. The computer program product of claim 10, further comprising instructions to:
    submerge, partially, a second side of the printed circuit board into the fluid bath to allow for the capillary fluid to partially fill the plated-through hole;
    measure a second meniscus height of the capillary fluid in the plated-through hole; and
    compare the second meniscus height with the calibrated height to determine the quality of the plated-through hole.

12. The computer program product of claim 10, wherein the fluid bath is gradually filled to partially submerge the first side of the printed circuit board.

13. The computer program product of claim 12, wherein the instructions to measure the first meniscus height is continuously measured as the fluid bath is gradually filled.

14. The computer program product of claim 11, wherein the fluid bath is gradually filled to partially submerge the second side of the printed circuit board.

15. The computer program product of claim 14, wherein the instructions to measure the second meniscus height is continuously measured as the fluid bath is gradually filled.

16. The computer program product of claim 10, wherein the fluid bath contains dyes to improve measuring the first meniscus height.

17. The computer program product of claim 10, further comprising instructions to:
- calculate a radius of the plated-through hole based on the first meniscus height; and
- determine whether the radius deviates from an expected radius for the plated-through hole.

18. The computer program product of claim 11, further comprising instructions to:
- calculate a radius of the plated-through hole based on the second meniscus height; and
- determine whether the radius deviates from an expected radius for the plated-through hole.

19. A system, comprising:
- a processor;
- a memory to store instruction, which when executed from the memory, cause the processor to perform operations,
  - submerge, partially, a first side of a printed circuit board into a fluid bath to allow for capillary fluid to partially fill a plated-through hole on the printed circuit board;
  - measure a first meniscus height of the capillary fluid in the plated-through hole; and
  - compare the first meniscus height with a calibrated height to determine a quality of the plated-through hole.

20. The system of claim 19, further comprising operations:
- submerge, partially, a second side of the printed circuit board into the fluid bath to allow for the capillary fluid to partially fill the plated-through hole;
- measure a second meniscus height of the capillary fluid in the plated-through hole; and
- compare the second meniscus height with the calibrated height to determine the quality of the plated-through hole.

* * * * *

UNITED STATES PATENT AND TRADEMARK OFFICE
CERTIFICATE OF CORRECTION

PATENT NO. : 11,112,351 B2  
APPLICATION NO. : 16/571311  
DATED : September 7, 2021  
INVENTOR(S) : Campbell et al.

Page 1 of 1

It is certified that error appears in the above-identified patent and that said Letters Patent is hereby corrected as shown below:

On the Title Page

Item (72) Inventors: should read as follows:  
Eric J Campbell, Rochester, MN (US);  
William James Anderl, Rochester, MN (US);  
Sarah K. Czaplewski-Campbell, Rochester, MN (US);  
Jason T. Wertz Pleasant Valley, NY (US);  
Brandon M. Kobilka, Fishkill, NY (US)

Signed and Sealed this  
Fifteenth Day of July, 2025

Coke Morgan Stewart  
*Acting Director of the United States Patent and Trademark Office*